(12) United States Patent
Yu

(10) Patent No.: US 6,444,503 B1
(45) Date of Patent: Sep. 3, 2002

(54) FABRICATING ELECTRICAL METAL FUSES WITHOUT ADDITIONAL MASKING

(75) Inventor: Ta-Lee Yu, Hsinchu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/068,922

(22) Filed: Feb. 7, 2002

(51) Int. Cl.[7] .............................. H01L 21/306
(52) U.S. Cl. ........................ 438/132; 438/601
(58) Field of Search ........................ 438/130–132, 438/467, 600–601

(56) References Cited

U.S. PATENT DOCUMENTS

| | | | |
|---|---|---|---|
| 5,068,706 A | 11/1991 | Sugita et al. | 357/51 |
| 5,472,901 A | 12/1995 | Kapoor | 437/60 |
| 5,827,759 A | 10/1998 | Froehner | 438/132 |
| 6,100,118 A | 8/2000 | Shih et al. | 438/132 |
| 6,162,686 A | 12/2000 | Huang et al. | 438/281 |
| 6,218,279 B1 | 4/2001 | Weber et al. | 438/601 |
| 6,323,111 B1 * | 11/2001 | Hui et al. | 257/529 |

* cited by examiner

Primary Examiner—Jey Tsai
(74) Attorney, Agent, or Firm—George O. Saile; Stephen B. Ackerman; Stephen G. Stanton

(57) ABSTRACT

A method of forming an electrical metal fuse comprising the following steps. A substrate is provided. A first patterned dielectric layer is formed over the substrate. The first patterned dielectric layer having at least one first opening exposing at least a portion of the substrate. A first planarized structure is formed within the at least one first opening. A second patterned dielectric layer is formed over the first planarized structure. The second patterned dielectric layer having a second opening exposing at least a portion of the first planarized structure. A second planarized structure is formed within the second opening whereby the first planarized structure and the second planarized structure comprise the electrical metal fuse. The electrical metal fuse having a middle portion, having a thickness and a width, between two end portions each having a thickness and a width. The thickness and width of the middle portion being less than the respective thickness and width of the end portions.

48 Claims, 3 Drawing Sheets

FABRICATING ELECTRICAL METAL FUSES WITHOUT ADDITIONAL MASKING

FIELD OF THE INVENTION

The present invention relates generally to semiconductor fabrication and more specifically to methods of fabricating electrical metal fuses.

BACKGROUND OF THE INVENTION

Current laser metal fuses require a relatively large space and are complex to fabricate when using copper (Cu) processes.

U.S. Pat. No. 6,218,279 B1 to Weber et al. describes a dual damascene copper fuse process.

U.S. Pat. No. 6,162,686 to Huang et al. describes a trench fuse process.

U.S. Pat. Nos. 5,068,706 to Sugita et al., 5,472,901 to Kapoor, 5,827,759 to Froehner and 6,100,118 to Shih et al. describe related fuse processes.

SUMMARY OF THE INVENTION

Accordingly, it is an object of one or more embodiments of the present invention to provide improved methods of forming electrical metal fuses without additional masking steps.

Other objects will appear hereinafter.

It has now been discovered that the above and other objects of the present invention may be accomplished in the following manner. Specifically, a substrate is provided. A first patterned dielectric layer is formed over the substrate. The first patterned dielectric layer having at least one first opening exposing at least a portion of the substrate. A first planarized structure is, formed within the at least one first opening. A second patterned dielectric layer is formed over the first planarized structure. The second patterned dielectric layer having a second opening exposing at least a portion of the first planarized structure. A second planarized structure is formed within the second opening whereby the first planarized structure and the second planarized structure comprise the electrical metal fuse. The electrical metal fuse having a middle portion, having a thickness and a width, between two end portions each having a thickness and a width. The thickness and width of the middle portion being less than the respective thickness and width of the end portions.

BRIEF DESCRIPTION OF THE DRAWINGS

The present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Unless otherwise specified, all structures, layers, steps, methods, etc. may be formed or accomplished by conventional steps or methods known in the prior art.

First Embodiment

FIGS. 1 to 4 illustrate the first preferred embodiment of the present invention.

Initial Structure

Figure 1:
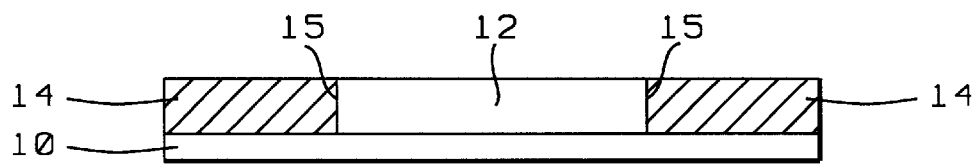
FIGS. 1 to 4 schematically illustrate a first preferred embodiment of the present invention with FIG. 4 being a top down view of FIG. 3.

As shown in FIG. 1, structure 10 includes n−1 intermetal dielectric (IMD) layer 12 with n−1 metal portions 14 formed within openings 15. N−1 IMD layer 12 and metal portions 14 are each preferably from about 1500 to 9000 Å thick and is more preferably from about 3000 to 5000 Å thick. N−1 IMD layer 12 is preferably formed of $SiO_2$, Black Diamond™, FSG, $SiO_2$/FSG or a low-k material and is more preferably formed of $SiO_2$/FSG.

Structure 10 is preferably a silicon substrate and is understood to possibly include a semiconductor wafer or substrate, active and passive devices formed within the wafer, conductive layers and dielectric layers (e.g., interpoly oxide (IPO), intermetal dielectric (IMD), etc.) formed over the wafer surface. The term "semiconductor structure" is meant to include devices formed within a semiconductor wafer and the layers overlying the wafer. Structure 10 may include conductive structures (not shown) in electrical contact with n−1 metal portions 14.

Formation of n IMD Layer 16

Figure 2:
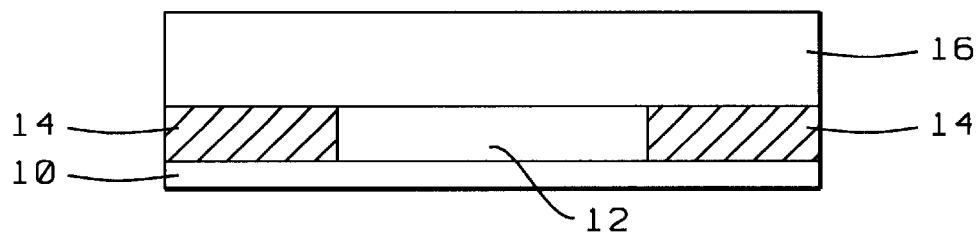

As shown in FIG. 2, n IMD layer 16 is formed over n−1 IMD layer 12 and metal portions 14 to a thickness of preferably from about 1500 to 9000 Å and more preferably from about 3000 to 5000 Å.

Formation of Dual Damascene Metal Structure 20 Within n IMD Layer 16

Figure 3:
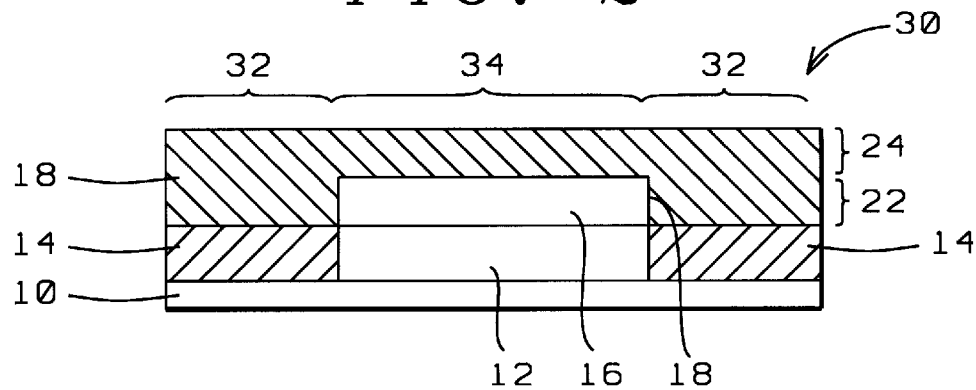

As shown in FIG. 3, n IMD layer 16 is patterned to form dual damascene opening 18 exposing at least a portion of n−1 metal portions 14.

A planarized metal dual damascene structure 20 is then formed within dual damascene opening 18 to complete formation of metal fuse 30. N−1 metal portions 14 and metal dual damascene structure 20 comprising metal fuse 30 are preferably comprised of copper (Cu), gold (Au), aluminum (Al) or silver (Ag) and are more preferably comprised of copper.

Fuse 30 includes: thicker and wider end portions 32 comprising n−1 metal portions 14 and that portion of metal dual damascene structure 20 above n−1 metal portions 14; and thinner and narrower middle portion 34 comprising that portion of metal dual damascene structure 20 over patterned n IMD layer 16.

End fuse portions 32 are preferably from about 8500 to 9500 Å thick and are more preferably about 9000 Å thick. Middle fuse portion 34 is preferably from about 3250 to 3750 Å thick and is more preferably about 3500 Å thick. The two different thicknesses of the end fuse portions 32 and the middle fuse portion 34 generates more current density gradient/thermal gradient.

It is noted that a single damascene process(es) may also be used to complete formation of fuse 30. That is, the end fuse portions 32 may comprise lower n−1 via metal portions 22 upon the n−1 metal portions 14 with an overlying n trench metal portion 24 that also forms middle fuse portion 34 as shown in FIG. 3.

Figure 4:
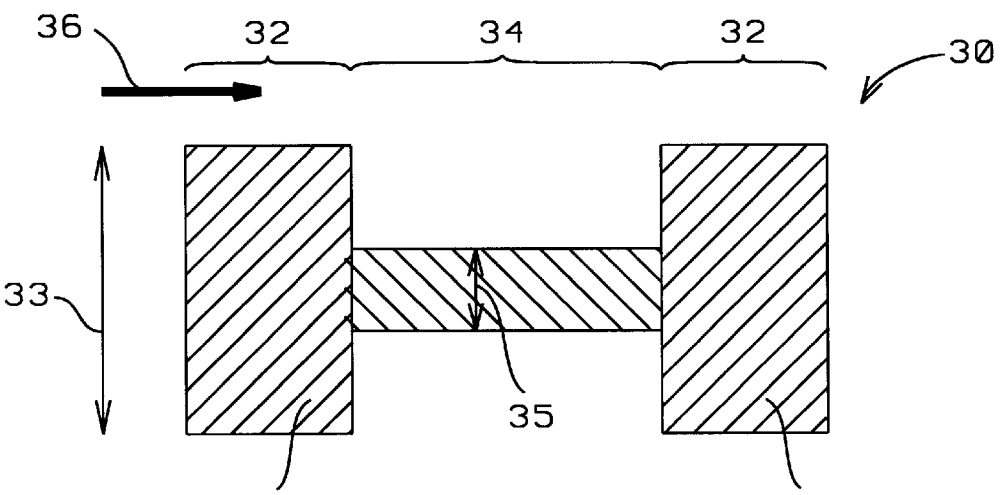

FIG. 4 is a top down view of the metal fuse 30 and illustrates the differences in widths between the end fuse portions 32 and the middle fuse portion 34. End fuse portions 32 have a width 33 of preferably from about 0.45 to 0.55 μm and more preferably about 0.50 μm. Middle fuse portion 34 has a width 35 of preferably from about 0.18 to 0.22 μm and more preferably about 0.20 μm. The differences in the widths 33, 35 between the end fuse portions 32 and the middle fuse portion 34, respectively, generates more current density gradient/thermal gradient.

The current electrons may flow in direction 36 as shown. As such, the region in the middle fuse portion proximate the left end fuse portion will open with a sufficient current flow 36 without the need for a laser to open the middle fuse portion.

The current density ratio of the fuse structure 30 of the first embodiment is preferably greater than about 10:1 (depending on width ratio) due to the width and thickness differences between the end fuse portions 32 and the middle fuse portion 34 as discussed above.

Second Embodiment

FIGS. 5 to 8 illustrate the first preferred embodiment of the present invention.

Figure 5:
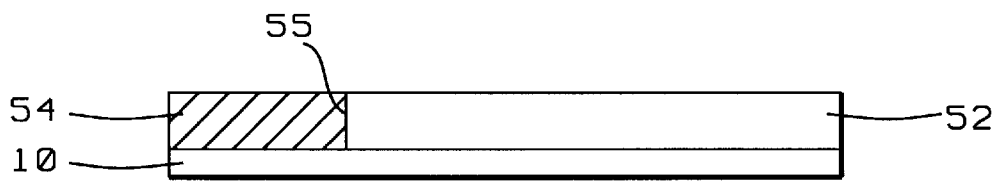
FIGS. 5 to 8 schematically illustrate a second preferred embodiment of the present invention with FIG. 8 being a top down view of FIG. 7.
Figure 6:
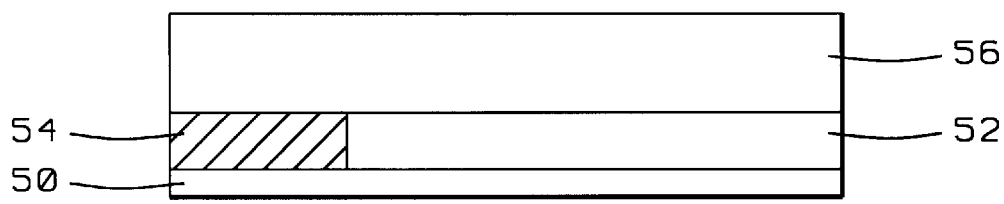

As shown in FIG. 5, structure 50 includes n−1 intermetal dielectric (IMD) layer 52 with an n−1 metal portions 54 formed within opening 55. N−1 IMD layer 52 and metal portion 54 are each preferably from about 1500 to 9000 Å thick and is more preferably from about 3000 to 5000 Å thick. N−1 IMD layer 52 is preferably formed of $SiO_2$, Black Diamond™, FSG, $SiO_2$/FSG or a low-k material and is more preferably formed of $SiO_2$/FSG.

Structure 50 is preferably a silicon substrate and is understood to possibly include a semiconductor wafer or substrate, active and passive devices formed within the wafer, conductive layers and dielectric layers (e.g., inter-poly oxide (IPO), intermetal dielectric (IMD), etc.) formed over the wafer surface. The term "semiconductor structure" is meant to include devices formed within a semiconductor wafer and the layers overlying the wafer. Structure 50 may include conductive structures (not shown) in electrical contact with n−1 metal portions 54.

Formation of n IMD Layer 56

As shown in FIG. 2, n IMD layer 56 is formed over n−1 IMD layer 52 and metal portion 54 to a thickness of preferably from about 1500 to 9000 Å and more preferably from about 3000 to 5000 Å.

Formation of Dual Damascene Metal Structure 60 Within n IMD Layer 56

As shown in FIG. 3, n IMD layer 56 is patterned to form dual damascene opening 58 exposing at least a portion of n−1 metal portion 54.

A planarized metal dual damascene structure 60 is then formed within dual damascene opening 58 to complete formation of metal fuse 70. N−1 metal portion 54 and metal dual damascene structure 60 comprising metal fuse 70 are preferably comprised of copper (Cu), gold (Au), aluminum (Al) or silver (Ag) and are more preferably comprised of copper.

Fuse 70 includes: thickest and wider end portion 72 comprising n−1 metal portion 54 and that portion of metal dual damascene structure 60 above n−1 metal portion 54; thicker and wider end portion 73; and thinnest and narrower middle portion 74 comprising that portion of metal dual damascene structure 60 over patterned n IMD layer 56.

Thickest end fuse portion 72 is preferably from about 8500 to 9500 Å thick and is more preferably about 9000 Å thick. Thicker end fuse portion 73 is preferably from about 4500 to 5500 Å thick and is more preferably about 5000 Å thick. Thinnest, middle fuse portion 74 is preferably from about 3250 to 3750 Å thick and is more preferably about 3500 Å thick. The different thicknesses of the end fuse portions 72, 73 and the middle fuse portion 74 generates more current density gradient/thermal gradient.

Figure 7:
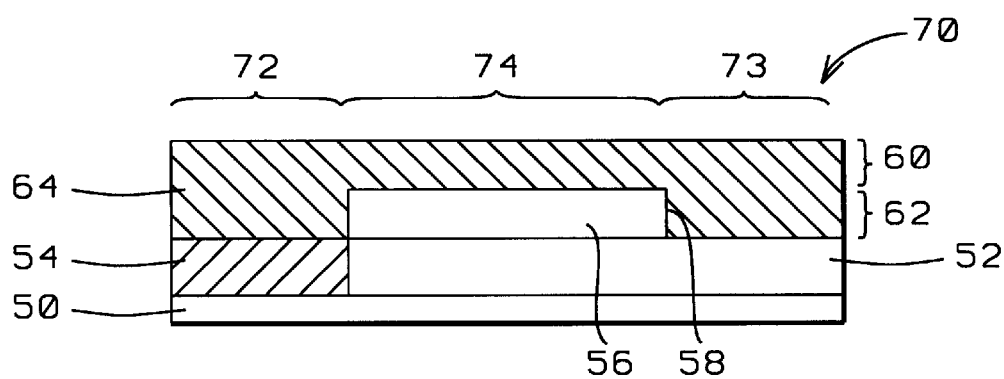

It is noted that a single damascene process(es) may also be used to complete formation of fuse 70. That is, the thickest end fuse portion 72 may comprise lower n−1 via metal portion 52 upon the n−1 metal portion 54 with an overlying n trench metal portion 64 that also forms thinnest middle fuse portion 74; and thicker end fuse portion 73 may comprise lower n−1 via metal portion 52 with the overlying n trench metal portion 64 that also forms thinnest middle fuse portion 74 as shown in FIG. 7.

Figure 8:
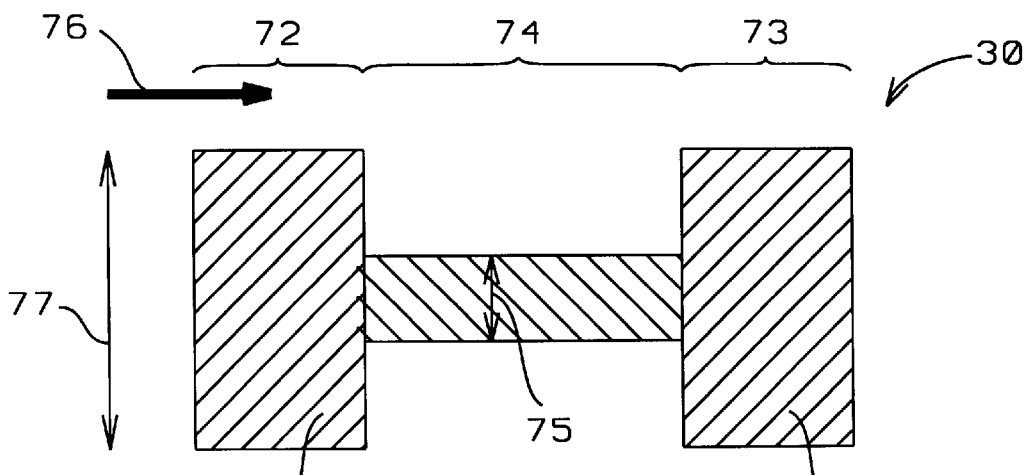

FIG. 8 is a top down view of the metal fuse 70 and illustrates the differences in widths between the thickest and thicker end fuse portions 72, 73, respectively, and the middle fuse portion 74. End fuse portions 72, 73 have a width 77 of preferably from about 0.45 to 0.55 μm and more preferably about 0.50 μm. Middle fuse portion 74 has a width 75 of preferably from about 0.18 to 0.22 μm and more preferably about 0.20 μm. The differences in the widths 77, 75 between the end fuse portions 72, 73 and the middle fuse portion 74, respectively, generates more current density gradient/thermal gradient.

The current electrons may flow in direction 76 as shown. As such, the region in the middle fuse portion proximate the thickest fuse portion 72 will open with a sufficient current flow 76 without the need for a laser to open the middle fuse portion.

The current density ratio of the fuse structure 70 of the second embodiment is preferably greater than about 10:1 (depending on width ratio) due to the width and thickness differences between the thickest end fuse portion 72 and the middle fuse portion 74 as discussed above.

Third Embodiment

FIGS. 9 to 12 illustrate the first preferred embodiment of the present invention.

Initial Structure

Figure 9:
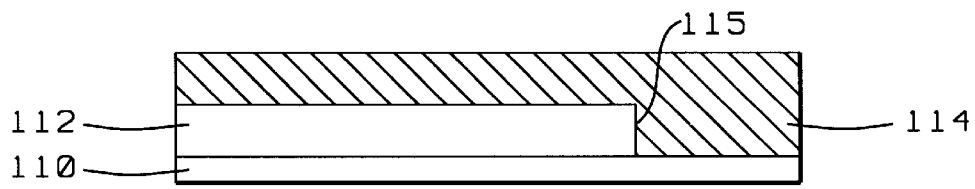
FIGS. 9 to 12 schematically illustrate a third preferred embodiment of the present invention with FIG. 12 being a top down cut-away view of the metal fuse 30 portion of FIG. 11.

As shown in FIG. 9, structure 110 includes n intermetal dielectric (IMD) layer 112 with an n dual damascene metal structure 114 formed within dual damascene opening 115. N IMD layer 112 is preferably from about 1500 to 9000 Å thick and is more preferably from about 3000 to 5000 Å thick. N−1 IMD layer 112 is preferably formed of $SiO_2$, Black Diamond™, FSG, $SiO_2$/FSG or a low-k material and is more preferably formed of $SiO_2$/FSG.

Structure 110 is preferably a silicon substrate and is understood to possibly include a semiconductor wafer or substrate, active and passive devices formed within the wafer, conductive layers and dielectric layers (e.g., inter-poly oxide (IPO), intermetal dielectric (IMD), etc.) formed over the wafer surface. The term "semiconductor structure" is meant to include devices formed within a semiconductor wafer and the layers overlying the wafer. Structure 110 may include conductive structures (not shown) in electrical contact with n dual damascene metal structure 114.

Formation of n+1 IMD Layer 16

Figure 10:
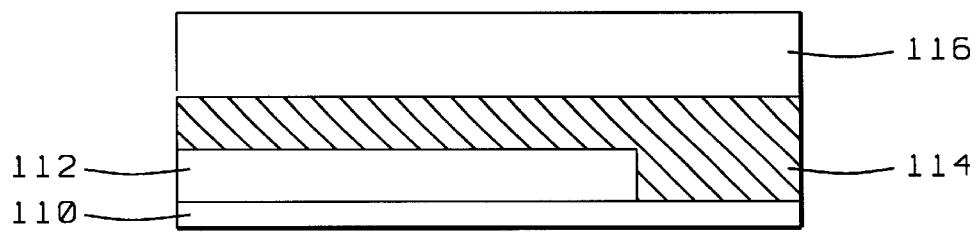

As shown in FIG. 10, n+1 IMD layer 116 is formed over n dual damascene metal structure 114 to a thickness of preferably from about 1500 to 9000 Å and more preferably from about 3000 to 5000 Å.

Formation of Metal Structure 120 Within n IMD Layer 16

Figure 11:
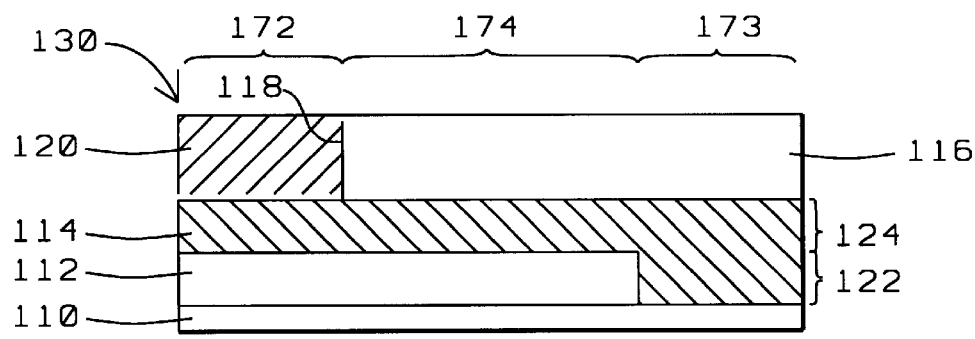

As shown in FIG. 11, n+1 IMD layer 16 is patterned to form opening 118 exposing at least a portion of n dual damascene metal structure 114.

A planarized n+1 metal 120 is then formed within opening 118 to complete formation of metal fuse 130. N dual damascene metal structure 114 and n+1 metal structure 120 comprising metal fuse 130 are preferably comprised of copper (Cu), gold (Au), aluminum (Al) or silver (Ag) and are more preferably comprised of copper.

Fuse 130 includes: thickest and wider end portion 172 comprising n+1 metal structure 120 and that portion of n dual damascene metal structure 114 below n+1 metal structure 120; thicker and wider end portion 173; and thinnest and narrower middle portion 174 comprising that portion of n dual damascene metal structure 114 over patterned n IMD layer 112.

Thickest end fuse portion 172 is preferably from about 8500 to 9500 Å thick and is more preferably about 9000 Å thick. Thicker end fuse portion 173 is preferably from about 4500 to 5500 Å thick and is more preferably about 5000 Å thick. Thinnest, middle fuse portion 174 is preferably from about 3250 to 3750 Å thick and is more preferably about 3500 Å thick. The different thicknesses of the end fuse portions 172, 173 and the middle fuse portion 174 generates more current density gradient/thermal gradient.

It is noted that a single damascene process(es) may also be used to complete formation of fuse 130. That is, the n dual damascene metal structure 114 may comprise lower n−1 via metal portion 122 with a separately formed overlying n trench metal portion 124 that also forms middle fuse portion 174 as shown in FIG. 11.

Figure 12:
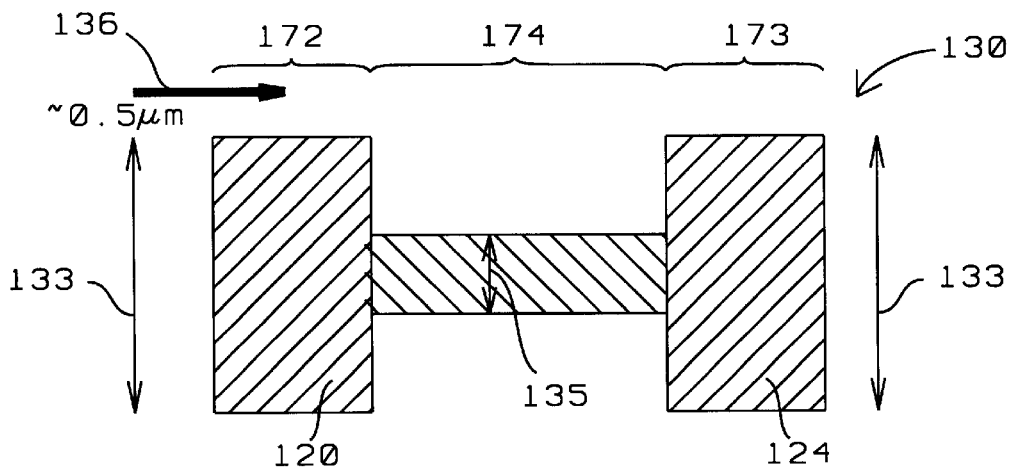

FIG. 12 is a top down cut-away view of the metal fuse 130 and illustrates the differences in widths between the end fuse portions 172, 173 and the middle fuse portion 174. End fuse portions 172, 173 have a width 133 of preferably from about 0.45 to 0.55 $\mu$m and more preferably about 0.50 $\mu$m. Middle fuse portion 174 has a width 135 of preferably from about 0.18 to 0.22 $\mu$m and more preferably about 0.20 $\mu$m. The differences in the widths 133, 135 between the end fuse portions 172, 173 and the middle fuse portion 174, respectively, generates more current density gradient/ thermal gradient.

The current electrons may flow in direction 136 as shown. As such, the region in the middle fuse portion 174 proximate the thickest end fuse portion 172 will open with a sufficient current flow 136 without the need for a laser to open the middle fuse portion 174.

The current density ratio of the fuse structure 130 of the first embodiment is preferably greater than about 10:1 (depending on width ratio) due to the width and thickness differences between the thickest end fuse portion 172 and the middle fuse portion 174 with current flow 136 as discussed above.

Each of the embodiments of the present invention use similar process steps and create more current density gradient/thermal gradient due to the differences in the thicknesses and widths between the end fuse portions and the middle fuse portions with the current flow. Further, the number of squares comprising the middle fuse portions increase the middle fuse portion length and therefore provides additional resistance and a higher temperature within the middle fuse portions proximate the end fuse portions.

Based upon Black's theory, approximately 30 mAmps for 20 $\mu$seconds would program copper fuses fabricated in accordance with each of the embodiments of the present invention.

Advantages of the Present Invention

The advantages of one or more embodiments of the present invention include:
1. a laser is not required to program the fuses;
2. a smaller space is required by the 'stacking' of the end fuse portions to create thicker end fuse portions;
3. fuse widths may be reduced due to this 'stacking' of the end fuse portions in successive technologies such as 0.25, 0.18, 0.13, etc.;
4. only a simple process is needed to fabricate fuses; and
5. the fuses fabricated are more reliable.

While particular embodiments of the present invention have been illustrated and described, it is not intended to limit the invention, except as defined by the following claims.

I claim:
1. A method of forming an electrical metal fuse, comprising the steps of:
   providing a substrate;
   forming a first patterned dielectric layer over the substrate; the first patterned dielectric layer having at least one first opening exposing at least a portion of the substrate;
   forming a first planarized structure within the at least one first opening;
   forming a second patterned dielectric layer over the first planarized structure; the second patterned dielectric layer having a second opening exposing at least a portion of the first planarized structure; and
   forming a second planarized structure within the second opening whereby the first planarized structure and the second planarized structure comprise the electrical metal fuse; the electrical metal fuse having a middle portion having a thickness and a width between two end portions each having a thickness and a width; the thickness and width of the middle portion being less than the respective thickness and width of the end portions.

2. The method of claim 1, wherein the width of the end portions is from about 0.45 to 0.55 $\mu$m and the width of the middle portion is from about 0.18 to 0.22 $\mu$m.

3. The method of claim 1, wherein the width of the end portions is about 0.50 $\mu$m and the width of the middle portion is from about 0.20 $\mu$m.

4. The method of claim 1, wherein the thickness of the end portions is from about 8500 to 9500 Å and the thickness of the middle portion is from about 3250 to 3750 Å.

5. The method of claim 1, wherein the thickness of the end portions is about 9000 Å and the thickness of the middle portion is about 3500 Å.

6. The method of claim 1, wherein the substrate is a silicon substrate.

7. The method of claim 1, wherein the substrate is a semiconductor wafer.

8. The method of claim 1, wherein the first patterned dielectric layer and the second patterned dielectric layer are each comprised of a material selected from the group consisting of $SiO_2$, FSG, $SiO_2$/FSG and a low-k material; and the first planarized structure and the second planarized structure are each comprised of a metal selected from the group consisting of copper, gold, aluminum and silver.

9. The method of claim 1, wherein the first patterned dielectric layer and the second patterned dielectric layer are each comprised of $SiO_2$/FSG; and the first planarized structure and the second planarized structure are each comprised of copper.

10. The method of claim 1, wherein the at least one first opening in the first patterned dielectric layer and the second opening in the second patterned dielectric layer are each formed using single damascene processes.

11. The method of claim 1, wherein one of the at least one first opening in the first patterned dielectric layer or the second opening in the second patterned dielectric layer is formed using a dual damascene process.

12. The method of claim 1, wherein the current density ratio of the electrical metal fuse is greater than about 10:1.

13. A method of forming an electrical metal fuse, comprising the steps of:
   providing a substrate;
   forming a first patterned dielectric layer over the substrate; the first patterned dielectric layer having a first opening and a second opening each exposing a portion of the substrate;

forming a first planarized structures within the first and second openings;

forming a second patterned dielectric layer over the first patterned dielectric layer and the first planarized structures; the second patterned dielectric layer having a third opening exposing at least a portion of each of the first planarized structures; and forming a second planarized structure within the third opening whereby the first planarized structures and the second planarized structure comprise the electrical metal fuse; the electrical metal fuse having a middle portion having a thickness and a width between two end portions each having a thickness and a width; the thickness and width of the middle portion being less than the respective thickness and width of the end portions.

14. The method of claim 13, wherein the width of the end portions is from about 0.45 to 0.55 μm and the width of the middle portion is from about 0.18 to 0.22 μm.

15. The method of claim 13, wherein the width of the end portions is about 0.50 μm and the width of the middle portion is from about 0.20 μm.

16. The method of claim 13, wherein the thickness of the end portions is from about 8500 to 9500 Å and the thickness of the middle portion is from about 3250 to 3750 Å.

17. The method of claim 13, wherein the thickness of the end portions is about 9000 Å and the thickness of the middle portion is about 3500 Å.

18. The method of claim 13, wherein the substrate is a silicon substrate.

19. The method of claim 13, wherein the substrate is a semiconductor wafer.

20. The method of claim 13, wherein the first patterned dielectric layer and the second patterned dielectric layer are each comprised of a material selected from the group consisting of $SiO_2$, FSG, $SiO_2$/FSG and a low-k material; and the first planarized structures and the second planarized structure are each comprised of a metal selected from the group consisting of copper, gold, aluminum and silver.

21. The method of claim 13, wherein the first patterned dielectric layer and the second patterned dielectric layer are each comprised of $SiO_2$/FSG; and the first planarized structures and the second planarized structure are each comprised of copper.

22. The method of claim 13, wherein the third opening in the second patterned dielectric layer is formed using single damascene processes.

23. The method of claim 13, wherein the third opening in the second patterned dielectric layer is formed using a dual damascene process.

24. The method of claim 13, wherein the current density ratio of the electrical metal fuse is greater than about 10:1.

25. A method of forming an electrical metal fuse, comprising the steps of:

providing a substrate;

forming a first patterned dielectric layer over the substrate; the first patterned dielectric layer having a first opening exposing at least a portion of the substrate;

forming a first planarized structure within the first opening;

forming a second patterned dielectric layer over the first patterned dielectric layer and the first planarized structure; the second patterned dielectric layer having a second opening exposing at least a portion of the first planarized structure; and forming a second planarized structure within the second opening whereby the first planarized structure and the second planarized structure comprise the electrical metal fuse; the electrical metal fuse having a middle portion having a thickness and a width between a first end portion having a thickness and a width and a second end portion having a thickness and a width; the thickness and width of the middle portion being less than the respective thicknesses and widths of the first and second end portions.

26. The method of claim 25, wherein the width of the first and second end portions is from about 0.45 to 0.55 μm and the width of the middle portion is from about 0.18 to 0.22 μm.

27. The method of claim 25, wherein the width of the first and second end portions is about 0.50 μm and the width of the middle portion is from about 0.20 μm.

28. The method of claim 25, wherein the first end portion includes the first planarized structure and the thickness of the first end portion is from about 8500 to 9500 Å, the thickness of the second end portion is from about 4500 to 5500 Å and the thickness of the middle portion is from about 3250 to 3750 Å.

29. The method of claim 25, wherein the first end portion includes the first planarized structure and the thickness of the first end portion is about 9000 Å, the thickness of the second end portion is about 5000 Å and the thickness of the middle portion is about 3500 Å.

30. The method of claim 25, wherein the substrate is a silicon substrate.

31. The method of claim 25, wherein the substrate is a semiconductor wafer.

32. The method of claim 25, wherein the first patterned dielectric layer and the second patterned dielectric layer are each comprised of a material selected from the group consisting of $SiO_2$, FSG, $SiO_2$/FSG and a low-k material; and the first planarized structure and the second planarized structure are each comprised of a metal selected from the group consisting of copper, gold, aluminum and silver.

33. The method of claim 25, wherein the first patterned dielectric layer and the second patterned dielectric layer are each comprised of $SiO_2$/FSG; and the first planarized structure and the second planarized structure are each comprised of copper.

34. The method of claim 25, wherein the second opening in the second patterned dielectric layer is formed using single damascene processes.

35. The method of claim 25, wherein the second opening in the second patterned electric layer is formed using a dual damascene process.

36. The method of claim 25, wherein the current density ratio of the electrical metal use is greater than about 10:1.

37. A method of forming an electrical metal fuse, comprising the steps of:

providing a substrate;

forming a first patterned dielectric layer over the substrate; the first patterned dielectric layer having a first opening exposing at least a portion of the substrate;

forming a first planarized structure within the first opening; the first planarized structure including a middle portion, a portion of the first end and the second end of the electrical metal fuse;

forming a second patterned dielectric layer over the first planarized structure; the second patterned dielectric layer having a second opening exposing at least a portion of the portion of the first end of the electrical metal fuse; and forming a second planarized structure within the second opening whereby the second planarized structure and the portion of the first end of the electrical metal fuse comprise the complete first end of the electrical metal fuse; whereby the middle portion of the electrical metal fuse has a thickness and a width, the first end of the electrical metal fuse has a thickness and a width and the second end of the electrical metal fuse has a thickness and a width; the width of the middle portion being less than the respective widths of the first and second end portions; the thickness of the first end being greater than the thickness of the second end of the electrical metal fuse; and the thickness of the second end being greater than the thickness of the middle portion of the electrical metal fuse.

38. The method of claim 37, wherein the width of the first and second end portions of the electrical metal fuse is from about 0.45 to 0.55 µm and the width of the middle portion of the electrical metal fuse is from about 0.18 to 0.22 µm.

39. The method of claim 37, wherein the width of the first and second end portions of the electrical metal fuse is about 0.50 µm and the width of the middle portion of the electrical metal fuse is from about 0.20 µm.

40. The method of claim 37, wherein the thickness of the first end portion of the electrical metal fuse is from about 8500 to 9500 Å, the thickness of the second end portion is from about 4500 to 5500 Å and the thickness of the middle portion of the electrical metal fuse is from about 3250 to 3750 Å.

41. The method of claim 37, wherein the thickness of the first end portion of the electrical metal fuse is about 9000 Å, the thickness of the second end portion is about 5000 Å and the thickness of the middle portion of the electrical metal fuse is about 3500 Å.

42. The method of claim 37, wherein the substrate is a silicon substrate.

43. The method of claim 37, wherein the substrate is a semiconductor wafer.

44. The method of claim 37, wherein the first patterned dielectric layer and the second patterned dielectric layer are each comprised of a material selected from the group consisting of $SiO_2$, FSG, $SiO_2$/FSG and a low-k material; and the first planarized structure and the second planarized structure are each comprised of a metal selected from the group consisting of copper, gold, aluminum and silver.

45. The method of claim 37, wherein the first patterned dielectric layer and the second patterned dielectric layer are each comprised of $SiO_2$/FSG; and the first planarized structure and the second planarized structure are each comprised of copper.

46. The method of claim 37, wherein the at first opening in the first patterned dielectric layer is formed using single damascene processes.

47. The method of claim 37, wherein the first opening in the first patterned dielectric layer is formed using a dual damascene process.

48. The method of claim 37, wherein the current density ratio of the electrical metal fuse is greater than about 10:1.

* * * * *